United States Patent [19]

Yoshisato et al.

[11] 4,426,627
[45] Jan. 17, 1984

[54] PHASE-LOCKED LOOP OSCILLATOR CIRCUIT UTILIZING A SUB-LOOP WITH A SECOND PHASE COMPARATOR

[75] Inventors: Akiyuki Yoshisato; Sadao Igarashi, both of Soma, Japan

[73] Assignee: Alps Electric Co., Ltd., Tokyo, Japan

[21] Appl. No.: 262,709

[22] Filed: May 11, 1981

[30] Foreign Application Priority Data

May 10, 1980 [JP] Japan ................... 55-61960

[51] Int. Cl.$^3$ ................... H03L 7/18; H03L 7/22
[52] U.S. Cl. ................... 331/12; 331/17; 331/25
[58] Field of Search ........... 331/10, 11, 12, 17, 331/25; 455/260

[56] References Cited

U.S. PATENT DOCUMENTS

| | | | |
|---|---|---|---|
| 3,579,281 | 5/1971 | Kam et al. | 331/17 |
| 3,600,700 | 8/1971 | Matsuo | 331/12 |
| 4,114,110 | 9/1978 | Nossen | 331/2 |
| 4,131,861 | 12/1978 | Malaviya | 331/2 |
| 4,205,277 | 5/1980 | Poinas | 331/12 |

*Primary Examiner*—Stanley D. Miller
*Assistant Examiner*—Sheila V. Clark
*Attorney, Agent, or Firm*—Guy W. Shoup; Gerard F. Dunne

[57] ABSTRACT

A phase-locked loop oscillator circuit having a reference signal generator, a voltage-controlled oscillator and a phase comparator comprises a second phase comparator. The first phase comparator is supplied with an output of the reference signal generator whose frequency has been lowered and also an output of the voltage-controlled oscillator whose frequency has been lowered. The second phase comparator is supplied with a signal which has been derived from an intermediate position of a higher-frequency path extending from the reference signal generator to the first phase comparator and also a higher-frequency signal which has been derived from an intermediate position of a path extending from the voltage-controlled oscillator to the first phase comparator. Outputs of the first and second phase comparators are added and applied to the voltage-controlled oscillator to reduce residual FM noise.

11 Claims, 5 Drawing Figures

PHASE-LOCKED LOOP OSCILLATOR CIRCUIT UTILIZING A SUB-LOOP WITH A SECOND PHASE COMPARATOR

BACKGROUND OF THE INVENTION

The present invention relates to a PLL (phase-locked loop) oscillator circuit which applies a phase-locked loop to control an oscillator of the microwave band.

In general, in microwave oscillators for use in a receiver for SHF (superhigh frequency) broadcasts, microwave communication apparatus, and the like, it is desired that the variation of the oscillation frequency as a result of temperature changes be small, that the levels of spurious signals be low and that a sharp oscillation spectrum with little residual FM noise be afforded. Heretofore, in receiving a downlink signal of 3.7–4.2 GHz from a satellite during satellite communication, a PLL oscillator circuit as shown in FIG. 1 has been adopted as a local oscillator of 2.94 GHz for frequency conversion, but it has been unsatisfactory.

Referring to FIG. 1 illustrative of a prior art device, a signal from a reference signal generator 1 employing a crystal oscillator is applied to a phase comparator 10 through frequency dividers 8 and 9 as a reference signal. The signal from the reference signal generator 1 is also applied to a frequency multiplier 2 to have its frequency multiplied by n. The multiplied signal is applied to a mixer 3, which is also supplied with a signal from a voltage-controlled oscillator 4 (hereinafter, abbreviated to "VCO"). The mixer 3 functions to convert the applied signals into a signal of a frequency equal to the difference between the frequencies of both the input signals. Unnecessary signal components are excluded through a band-pass filter and amplifier 5 (abbreviated to "BPF·AMP") selectively amplifies a desired signal component. The signal from the BPF·AMP 5 is applied to the phase comparator 10 through frequency dividers 6 and 7.

The phase comparator 10 compares the phases of the applied signals, and provides a signal corresponding to the phase difference. The signal from the phase comparator 10 is applied to a low-pass filter and amplifier 11 (abbreviated to "LPF·AMP"). The resultant signal from the LPF·AMP 11 is applied to the VCO 4 to control the oscillation frequency thereof. The PLL oscillator circuit is constructed as thus far described. Assuming that the oscillation frequency of the reference signal generator 1 is 74.904459 MHz and that the frequency multiplication ratio of the frequency multiplier 2 is 39, the output frequency of the BPF·AMP 5 becomes 18.726115 MHz. Also, assuming that the frequency division ratios of the frequency dividers 6 and 7 are 4 and 256, respectively, and that the frequency division ratios of the frequency dividers 8 and 9 are 4 and 1,024, respectively, the phase comparison frequency of the phase comparator 10 becomes approximately 18 kHz.

With such prior art, when viewed over a long time, the frequency stability of the VCO 4 is substantially equal to the precision of the crystal oscillator because the control of the phase-locked loop is dependent upon the precision of the reference signal generator 1. However, the residual FM noise which is the frequency stability as viewed for a short time is determined by the residual FM noise characteristics of the VCO 4 itself in the case where the control voltage of the VCO 4 is fixed. This signifies the disadvantage that, in spite of the phase-locked loop control, the frequency stability cannot be made better than the residual FM noise characteristics of the VCO 4 itself.

When the LPF·AMP 11 has the passing band width thereof broadened to pass even the noise frequency of the residual FM noise, and the control time of the phase-locked loop is shortened so that even the noise frequency may be responded to, the residual FM noise decreases. This measure, however, results in increasing a control on the VCO 4 and subjecting the VCO 4 to the FM modulation with the reference signal of the phase comparator 10, so that a phase-locked loop control of good FM noise characteristics cannot easily be made.

Summary of the Invention:

An object of the present invention is to provide a phase-locked loop oscillator circuit which has enhanced frequency stability, spurious characteristics and residual FM noise characteristics.

According to one aspect of performance of the present invention, a phase-locked loop oscillator circuit comprises a reference signal generator, a voltage-controlled oscillator, and a first phase comparator as well as a second phase comparator. The first phase comparator is supplied with an output of the reference signal generator whose frequency has been lowered and also an output of the voltage-controlled oscillator whose frequency has also been lowered; the second phase comparator is supplied with a higher frequency signal which has been derived from an intermediate position of a path extending from said reference signal generator to the first phase comparator and also a higher frequency signal which has been derived from an intermediate position of a path extending from said voltage-controlled oscillator to the first phase comparator. Outputs of the first and second phase comparators are added and applied to the voltage-controlled oscillator.

PREFERRED EMBODIMENT OF THE INVENTION

Figure 1:
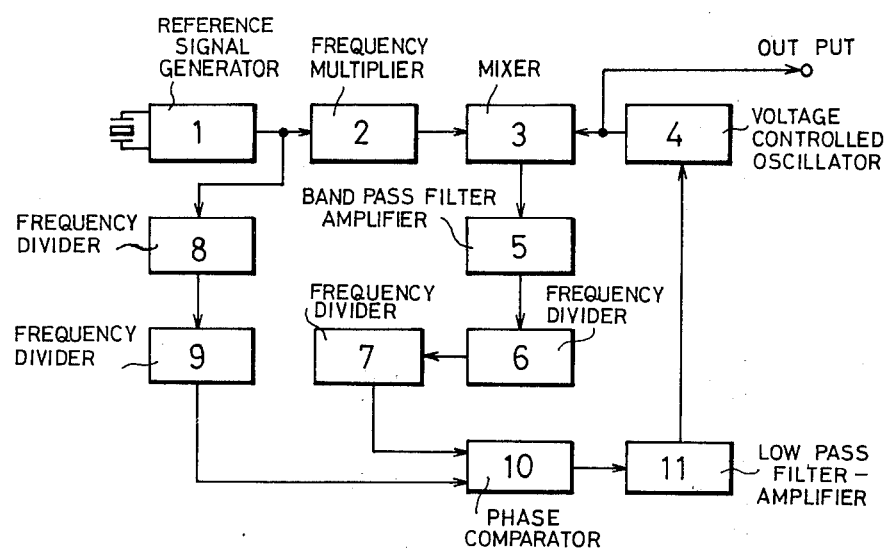
FIG. 1 is a block diagram showing a prior art PLL oscillator circuit.

The present invention has eliminated the disadvantages described before, and an embodiment thereof will be described with reference to FIG. 2. The PLL oscillator circuit of this embodiment consists of a main loop and a sub loop. In the main loop, an output from a reference signal generator 1 is applied to a first phase comparator 10 of the digital type through frequency dividers 8 and 9 as a reference signal. The output of the reference signal generator 1 is also applied through a frequency multiplier 2 to a mixer 3, which converts the frequency of the multiplied signal and the frequency of the output of a voltage-controlled oscillator (VCO) 4 also applied to the mixer 3. A frequency of the difference between the frequencies of both these signals is thus derived, and is passed through a band-pass filter and amplifier (BPF·AMP) 5 and divided by frequency dividers 6 and 7. The resultant signal is applied to the first phase comparator 10, which detects the phase difference of this signal with respect to the reference signal 5 and provides a signal corresponding thereto. The phase difference signal is applied to the VCO 4 through a low-pass filter and amplifier (LPF·AMP) 11 so as to control the oscillation frequency of the VCO 4. On the other hand, in a sub loop, an output of the frequency divider 8 is applied to a phase shifter 12 and is shifted a desired phase angle. The resultant signal is applied to a second phase comparator 13 of the analog type as a reference signal. An output of the BPF·AMP 5 is applied as the other input of the second phase comparator 13. The phase comparator 13 detects the phase difference of the output of the BPF·AMP 5 with respect to the reference signal and provides a signal corresponding thereto. The phase difference signal is applied to the LPF·AMP 11 through a direct-current amplifier 14 so as to control the VCO 4. Owing to the main loop and the sub loop, the VCO 4 has its oscillation frequency controlled by a signal which is a combination of the output of the first phase comparator 10 and the output of the second phase comparator 13.

Figure 3:
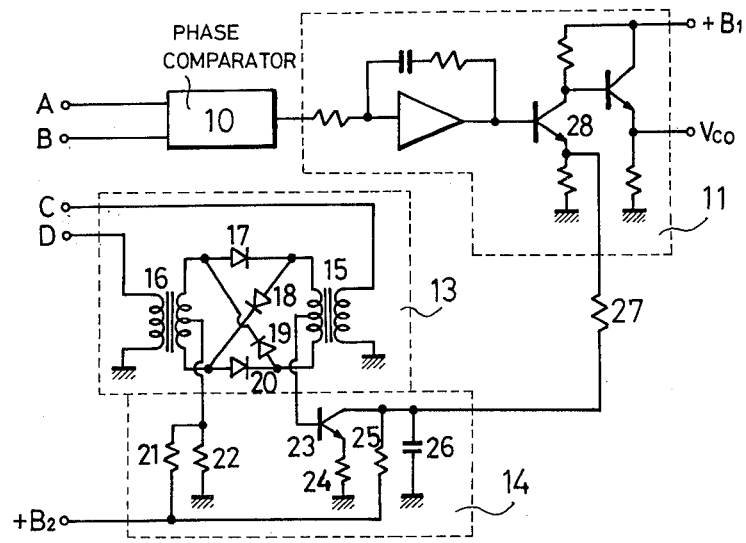
FIG. 3 is a circuit diagram showing in detail some parts of the embodiment of the present invention.
Figure 4:
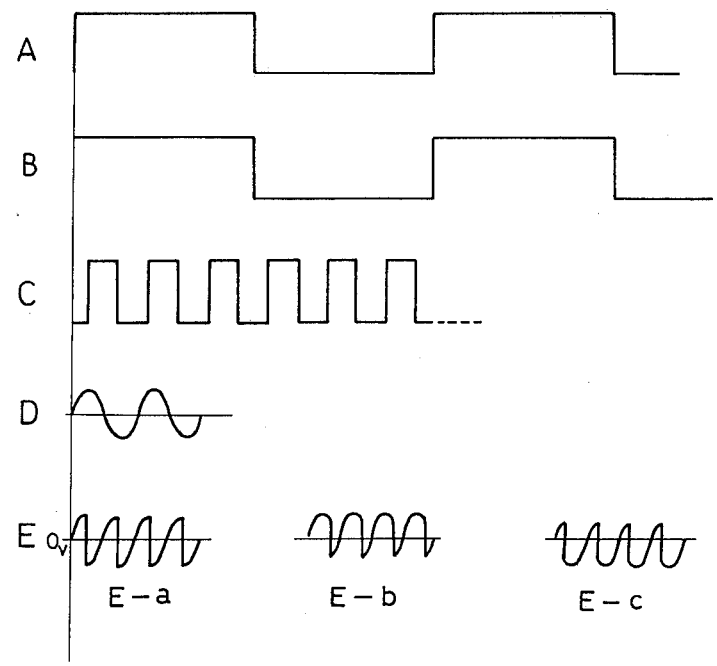
FIG. 4 is a time chart showing the waveforms of signals in several places of the embodiment of the present invention.

FIG. 3 is a detailed circuit diagram of the LPF·AMP 11, the second phase comparator 13 and the direct-current amplifier 14. FIG. 4 shows waveforms in various places of FIG. 3.

Figure 2:
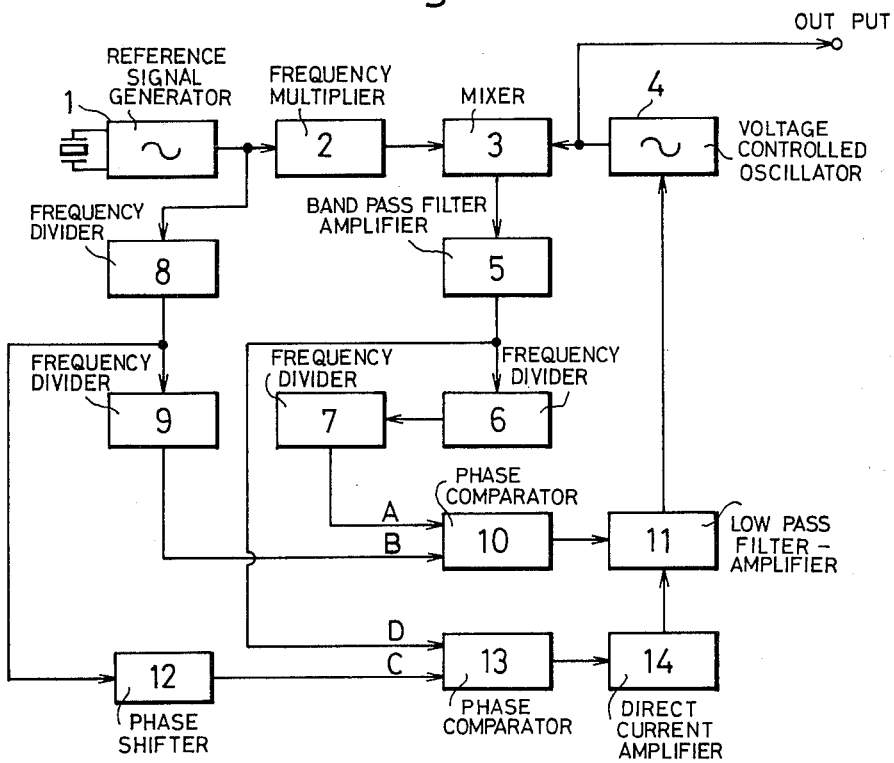
FIG. 2 is a block diagram showing an embodiment of the present invention.

Referring to FIGS. 2, 3 and 4, the signals which are applied to the first phase comparator 10 are a signal from the frequency divider 7 as illustrated by a waveform A and a signal from the frequency divider 9 as illustrated by a waveform B. The phases of the signals are coincident, so that the main loop is in the locked state. As regards the second phase comparator 13, a signal illustrated by a waveform C is applied from the frequency divider 8 through the phase shifter 12 to a transformer 15, and a signal from the BPF·AMP 5 as illustrated by a waveform D is applied to a transformer 16. The phase shifter 12 is set so that the phase difference between the signals C and D may become, for example, 90 degrees. Although, in the illustration of FIG. 4, the ratio between the frequencies of the signals applied to the second phase comparator 13 and the frequencies of the signals applied to the first phase comparator 10 is 3 (three), actually the frequency division ratios of the frequency dividers 6-9 are made equal to those of the prior art and the ratio is 1,024. The second phase comparator 13 adopts a double balanced detector circuit which consists of the transformers 15 and 16 and diodes 17 to 20. When the signals having the phase difference of 90 degrees are applied onto the primary sides of the transformers 15 and 16, they are detected by the diodes 17 to 20. In this case, an output signal which is derived from the center tap of the transformer 15 becomes a waveform which is symmetric with respect to 0 (zero) V as illustrated by E-a. When this output signal is applied to the direct-current amplifier 14 consisting of a transistor 23, bias resistors 21, 22, 24 and 25 and a capacitor 26 serving as a low-pass filter for by-passing A.C. components and the A.C. components of the signal are removed and the resultant DC component becomes 0 V. Therefore, when the phase of the signal to be applied to the transformer 16 undergoes a phase deviation in the leading direction or the lagging direction on account of residual FM noise of the VCO 4, the output signal of the second phase comparator 13 no longer has a symmetric waveform with respect to 0 V and becomes a signal having a waveform as shown by E-b or E-c. When this signal is applied to the direct-current amplifier 14, its A.C. components are removed, and an error signal which is a positive or negative D.C. voltage appears. The error signal is applied through a coupling resistor 27 to the emitter of a transistor 28 which forms a part of the LPF·AMP 11 of the main loop, so as to combine the error signals of the main loop and the sub loop. The resultant signal is applied to the VCO 4 so as to control the oscillation frequency thereof.

The gain of the sub loop is determined by the level of the signal from the BPF·AMP 5, the amplification gain of the transistor 23 and the resistance value of the coupling resistor 27, and a desired gain is freely attained. In the case where the phase difference detectability of the second phase comparator 13 is equal to that of the first phase comparator 10, the detectabilities of the main loop and the sub loop relate to the frequencies of the signals handled, and the detectibility of the sub loop which handles a frequency 1,024 times higher is, therefore, higher. The sub loop can detect a minute residual FM noise which the main loop cannot detect, and can feed it back to the VCO 4 so as to control the VCO 4.

The sub loop subjects the VCO 4 to the FM modulation the reference signal of the second phase comparator 13. Since, however, the main loop takes charge of the main control of the VCO 4, the degree of the FM modulation of the VCO 4 by the sub loop is very low. In the case where the phase-locked loop oscillator circuit of this embodiment is applied to, for example, a receiver for the SHF broadcast, the baseband frequencies are 0–4.2 MHz for video signals and 6.8 MHz for voice frequencies, and the reference signal of the second phase comparator 13 is at 18 MHz, so the frequencies are greatly different. Therefore, the performance of the receiver for the SHF broadcast is not worsened by the 18 MHz component.

Figure 5:
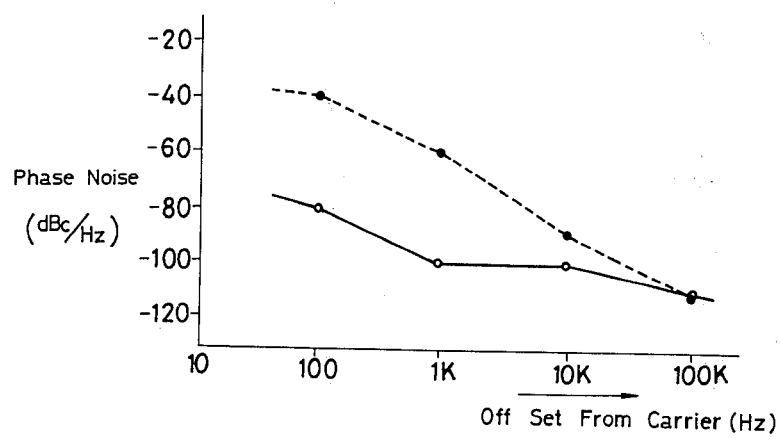
FIG. 5 is a graph showing the phase noise characteristics of the embodiment of the present invention.

FIG. 5 is a graph showing measured phase noise characteristics. In the embodiment of the present invention as illustrated by a solid line, noise lying close to a carrier within an offset of 1 kHz are much smaller than in the prior art illustrated by a dotted line. This proves that the effect of the sub loop is great.

Although the phase shifter 12 in the embodiment has been explained as shifting the phase 90 degrees, the phase shift need not always be exactly 90 degrees. Even when some error is involved, adjustments are easy, and a simple circuit consisting of resistors and capacitors suffices. In addition, the sub loop can be constructed of a single IC to which merely the resistors and capacitors for the phase shifter and the capacitor for the low-pass filter are added. This is advantageous in assemblage.

As described above, the present invention includes the sub loop, thereby to bring forth such great effects that the residual FM noise can be reduced to an almost negligible magnitude, which ensures a sharp oscillation spectrum, and that unwanted spurious levels are low, which ensures an output level of high stability.

We claim:

1. A phase-locked loop oscillator circuit comprising a reference signal generator, a voltage-controlled oscillator, and a first phase comparator as well as a second phase comparator; means supplying said first phase comparator with an output of said reference signal generator whose frequency has been lowered and also an output of said voltage-controlled oscillator whose frequency has been lowered; means supplying said second phase comparator with a signal from said reference signal generator having a frequency higher than the signal applied to said first phase comparator from said reference signal generator and also a signal from said voltage-controlled oscillator having a frequency higher than the signal applied to said first phase comparator from said voltage-controlled oscillator; and means for adding the outputs of said first and second phase comparators together to generate a composite control signal applied to said voltage-controlled oscillator.

2. A phase-locked loop oscillator circuit according to claim 1, wherein said first phase comparator is a digital type phase comparator, and said second phase comparator is an analog type phase comparator.

3. A phase-locked loop oscillator circuit according to claim 1, wherein either of the two signals to be applied to said second phase comparator is passed through a phase shifter prior to receipt by said second phase comparator so as to have a phase difference.

4. A phase-locked loop oscillator circuit including a voltage-controlled oscillator adapted to produce an oscillating output signal having a frequency varied by a control signal applied thereto, and control means for generating said control signal to correct deviations in the oscillating output signal including those produced by said voltage-controlled oscillator, said control means including means for generating a reference signal having a predetermined frequency, means for receiving said reference signal and producing a divided signal lower in frequency, means receiving the output signal from said voltage-controlled oscillator for producing a VCO signal lower in frequency than said output signal, means including a first phase comparator for receiving said divided signal and said VCO signal for producing a first error signal in response to any difference between the phases of said divided signal and said VCO signal, and means including a second phase comparator receiving a second divided signal corresponding to said reference signal but having a frequency higher than said divided signal and a second VCO signal corresponding to said VCO signal but having a higher frequency for producing a second error signal responsive to low-level drift in said output signal, and means for adding said first and second signals for producing said control signal.

5. A circuit according to claim 4, said second phase detector producing a second error signal having a dc component proportional to said low-level drift and including an amplifier for amplifying said dc component.

6. A circuit according to claim 4, said divided signal being produced by dividing the frequency of said reference signal by a first and then a second frequency divider, and said second signal being taken from the output of said first frequency divider.

7. A circuit according to claim 6, said VCO signal being produced by dividing the frequency of said output signal by a first and then a second VCO frequency divider, and said second VCO signal being taken from the input of said first VCO frequency divider.

8. A circuit according to claim 7, further including means including a phase shifter for shifting the phase of one of said second divided signal and said second VCO signal prior to receipt by said second phase comparator.

9. A circuit according to claim 4, said VCO signal being produced by dividing the frequency of output signal by a first and then a second VCO frequency divider, and said second VCO signal being taken from the input of said first VCO frequency divider.

10. A circuit according to claim 9, further including means including a phase shifter for shifting the phase of one of said second divided signal and said second VCO signal prior to receipt by said second phase comparator.

11. A circuit according to claim 4, further including means including a phase shifter for shifting the phase of one of said second divided signal and said second VCO signal prior to receipt by said second phase comparator.

* * * * *